(12) United States Patent
Ohta

(10) Patent No.: US 6,361,908 B1
(45) Date of Patent: Mar. 26, 2002

(54) LAYOUT DESIGNING METHOD OF A DISPLAY DEVICE

(75) Inventor: Kazutoshi Ohta, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/572,945

(22) Filed: May 18, 2000

(30) Foreign Application Priority Data

Aug. 26, 1999 (JP) ............................................. 11-240228

(51) Int. Cl.⁷ ................................................. G03F 9/00
(52) U.S. Cl. .......................................... 430/22; 430/30
(58) Field of Search ..................................... 430/22, 30

(56) References Cited

FOREIGN PATENT DOCUMENTS

JP          10-232377          9/1998

*Primary Examiner*—Christopher G. Young
(74) *Attorney, Agent, or Firm*—Staas & Halsey

(57) ABSTRACT

Each layer of a display device is divided into many shot areas. Suspected division area is then set so that corresponding areas for all of the layers are included in it. All of the layers are then divided at one time along the suspected division area. Finally, a portion in the suspected division area that is not included in shot area of any layer is provided with a light-resistant coating.

6 Claims, 25 Drawing Sheets

LAYOUT DESIGNING METHOD OF A DISPLAY DEVICE

FIELD OF THE INVENTION

The present invention relates to layout designing method of a display device.

BACKGROUND OF THE INVENTION

In a liquid display device using a TFT (thin film transistor) as a switching element, for instance, four panels 12 are prepared on a sheet of glass plate 11 as shown in FIG. 1. Each of the panels 12 is divided into, for instance, four shot areas (A, B, C, D) as shown in FIG. 2.

FIG. 3 shows a panel 12 in an enlarged form. In FIG. 3, in a display section of each of the shot areas 12a, 12b, 12c, and 12d indicated by the signs A, B, C, and D, a TFT switching pattern 13, a pixel pattern 14, or the like are formed as shown in FIG. 4. The TFT switching pattern 13 is formed with a layer construction consisting of 3 to 7 layers with such components as a gate bus line 13g or a drain bus line 13d.

In the layout designing method based on the conventional technology, at first panel data concerning TFTs or pixels in a display device is prepared, and then one sheet of panel 12 is divided with a division tool or the like into a plurality of shot areas 12a, 12b, 12c, and 12d. However, if the gate bus line 13g or drain bus line 13d is divided at a place where a switching performance of a transistor is badly affected, or if one pixel pattern 14 is divided into two sections, characteristics of the pixel at such a place changes, which in turn may cause non-uniformity in display.

To prevent generation of this non-uniformity in display, it is necessary to divide a G layer in which the gate bus line 13g is formed along a first division line A—A evading the gate electrode section as shown in FIG. 5. Regarding I layer in which the drain bus line 13d is formed, it is necessary to divide this I layer along a second division line B—B evading the source/drain area. Regarding Px layer in which the pixel pattern is formed, it is necessary to divide this Px layer along a third division line C—C so that a single pixel will not be divided.

In other layers not shown in these figures, there are line positions suited to division, and the division line positions are generally different from layer to layer. In other words, it is impossible to divide one panel into a plurality of shot areas by setting the same division line for all layers.

Therefore, in the conventional technology, appropriate division line is set for each layer. Following procedure is employed when manufacturing a display device. That is, as shown in FIG. 6, reticules 13a, 13b, 13c, 13d corresponding to the shot areas 12a, 12b, 12c, 12d indicated by the signs A, B, C, D are prepared for each layer, and exposure is made to resist applied on the glass plate 11 using these reticules 13a, 13b, 13c, and 13d successively and with an exposure device such as a stepper.

The layout designing method based on the conventional technology is described below with reference to FIG. 7 to FIG. 15B. FIG. 7 is a flow chart showing a flow in reticule preparation based on the conventional type of layout designing method. FIG. 8 to FIG. 15B show examples of geometrical patterns so that the flow chart above can easily be understood.

The examples of geometrical pattern shown in FIG. 8 are based on the assumption that a panel 21 is divided into four sections and comprises two layers, namely a G layer in which a heart-shaped pattern 22 is formed and an I layer in which a square pattern 23 is formed. As shown in FIG. 9, G1–G2 and I1–I2 are division lines for the G layer and I layer respectively. It is assumed that there occurs no functional problem in the panel pattern shown in the figure.

When layout designing is started, at first, panel data is prepared as shown in FIG. 7 (step S1). FIG. 8. shows a panel image prepared based on the panel data. At the next step, all layers are divided into a plurality of areas respectively (step S2). FIG. 9 shows divided images of all layers, namely the G layer and I layer in this example.

Images for the shot areas obtained by dividing the panel are located in data concerning the reticule image, thus a reticule image being prepared (step S3). Process patterns such as an alignment mark are prepared at the same time.

At the next step, a single layer, for instance, the G layer is divided (step S4). FIG. 10 shows an image 24 of those obtained by dividing the G layer to four sections. FIG. 10 to FIG. 15B show only GA and IA shot areas positioned at the light upper section of the FIG. 9 together with the G layer and I layer. A shading band (described as blind pattern hereinafter) and an auxiliary pattern are added to a section around the four images obtained by dividing the G layer (step S5). FIG. 11 shows a state where a blind pattern 25 is added to a divided image for the shot area GA in the G layer.

At the next step, whether all of the layers have been divided or not is determined (step S6). In this example, as the I layer has not been divided, the processing at step S4 is executed to divide the I layer. FIG. 12 shows an image 26 of the shot area IA among the four areas obtained by dividing the I layer. At the next step, a blind pattern and an auxiliary pattern are added to a section around the four images obtained by dividing the I layer (step S5). FIG. 13 shows a state where a blind pattern 27 is added to a divided image 26 of the shot area IA in the I layer.

The processing from step S4 to step S6 is repeated until all of the layers are divided, and when all of the layers are divided, preparation of designing data is finished (step S7). FIG. 14A and FIG. 14B show the prepared designing data 28, 29 for the G layer and I layer respectively.

Based on the prepared designing data, exposure data and reticules are prepared (step S8). FIG. 15A and FIG. 15B show exposure data and reticules 30, 31 for the G layer and I layer respectively.

In the layout designing method based on the conventional technology as described above, the processing for division is executed by setting divided areas for each layer taking into account a switching pattern or a pixel pattern, so that the processing for division is required to be executed repeatedly until all layers have been divided. Time required for dividing one layer is around 1 hour. Therefore, for instance, for a 15-inch display device comprising 5 layers about five hours are required until the processing for dividing all of the layers is finished.

Therefore, although reduction of production cost and designing cost for a display device is strongly desired recently, it has been difficult to reduce the designing cost.

SUMMARY OF THE INVENTION

It is an object of the present invention to provide a layout designing method of a display device which makes it possible to shorten time required for designing a display device and also to reduce the designing cost.

To achieve the object described above, in the layout designing method of a display device according to one aspect of the present invention, when designing a display panel comprising a plurality of layers and designed by dividing each layer to a plurality of short areas, a suspected division area is set so that shot areas corresponding to all layers are included, all of the layers are divided in batch along the suspected division area, and by treating a portion not included in a shot area of each layer in the suspected division area obtained as described above, an unnecessary portion is hid.

In the layout designing method of a display device of another aspect of the present invention, when designing a display panel comprising a plurality of layers and designed by dividing each layer to a plurality of short areas, all of divided areas in all layers are aligned to each other by aligning other layers to a reference layer, and all of the layers are divided in batch along the aligned areas.

Shot areas are positioned at reticules by offsetting each shot area by a rate of displacement of other layers to the reference layer. Or, a rate of displacement of other layers to the reference layer is given as an offset rate in exposure to an exposure device.

According to the invention, as all of layers can be divided in batch, the time required for division can be shortened, and further the reduction cost can be reduced.

Other objects and features of this invention will become apparent from the following description with reference to the accompanying drawings.

DESCRIPTION OF THE PREFERRED EMBODIMENTS

The display device layout designing methods according to embodiments of the present invention are described in detail below.

Figure 16:
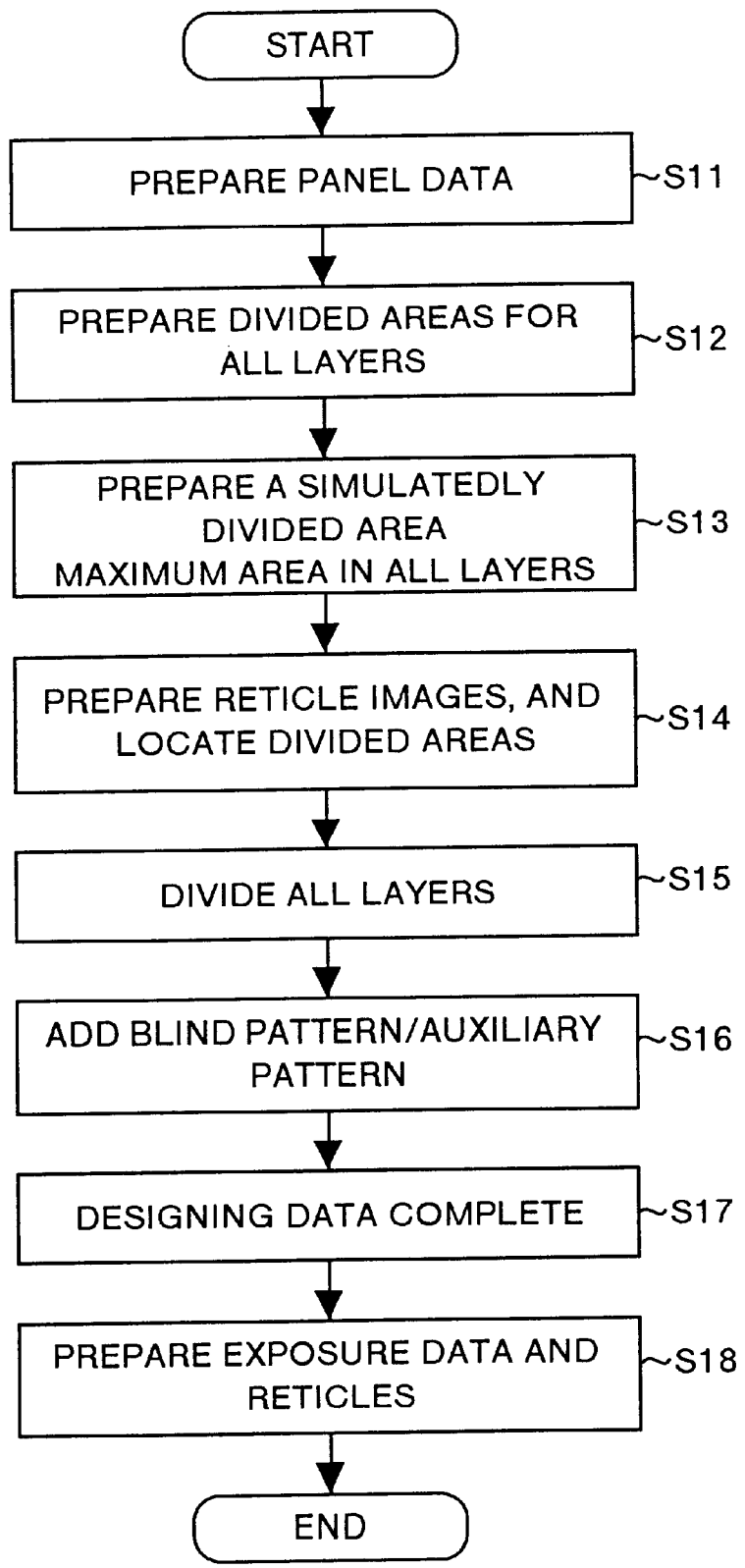
FIG. 16 is a flow chart showing a flow of operations for preparation of reticules based on a layout designing method according to a first embodiment of the present invention.
Figure 17A:
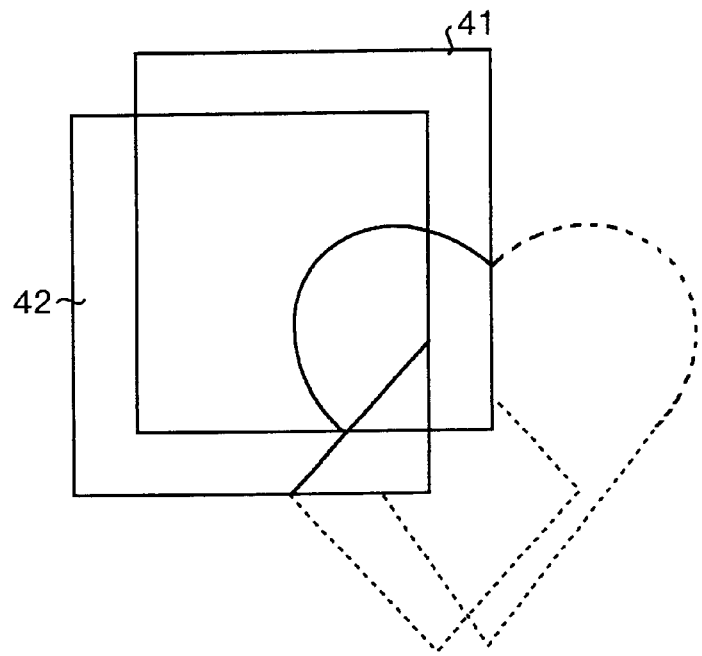
FIG. 17A is a simulated view showing an example of geometrical pattern prepared in the operation flow shown in FIG. 16.
Figure 17B:
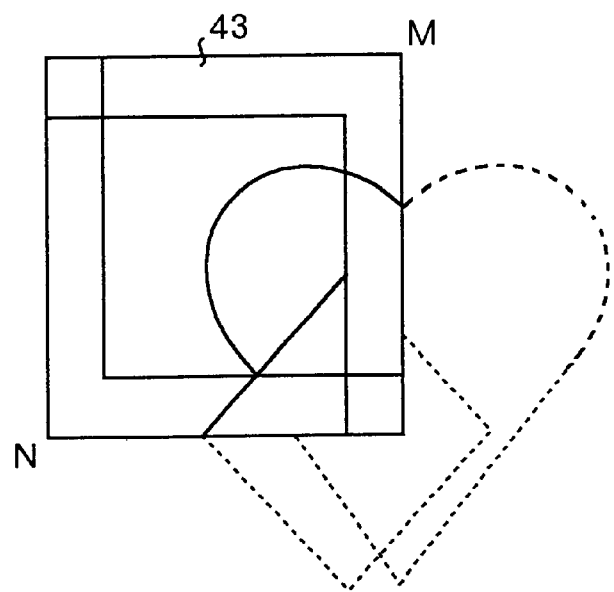
FIG. 17B is a simulated view showing an example of geometrical pattern prepared in the operation flow shown in FIG. 16.

FIG. 16 is a flow chart showing a flow of operations for preparation of reticules based on the display device layout designing method according to a first embodiment of the present invention. FIG. 17A to FIG. 21B. show examples of geometric pattern provided so that the flow chart can easily be understood, and the examples of geometric pattern are applicable when layout designing is executed for the panel image and division image shown in FIG. 8 and FIG. 9 respectively. FIG. 17A to FIG. 21B show only shot area GA and shot area IA positioned in the left upper section of FIG. 9 in both the G layer and I layer (same is the case with FIG. 23A to FIG. 27B).

Figure 1:
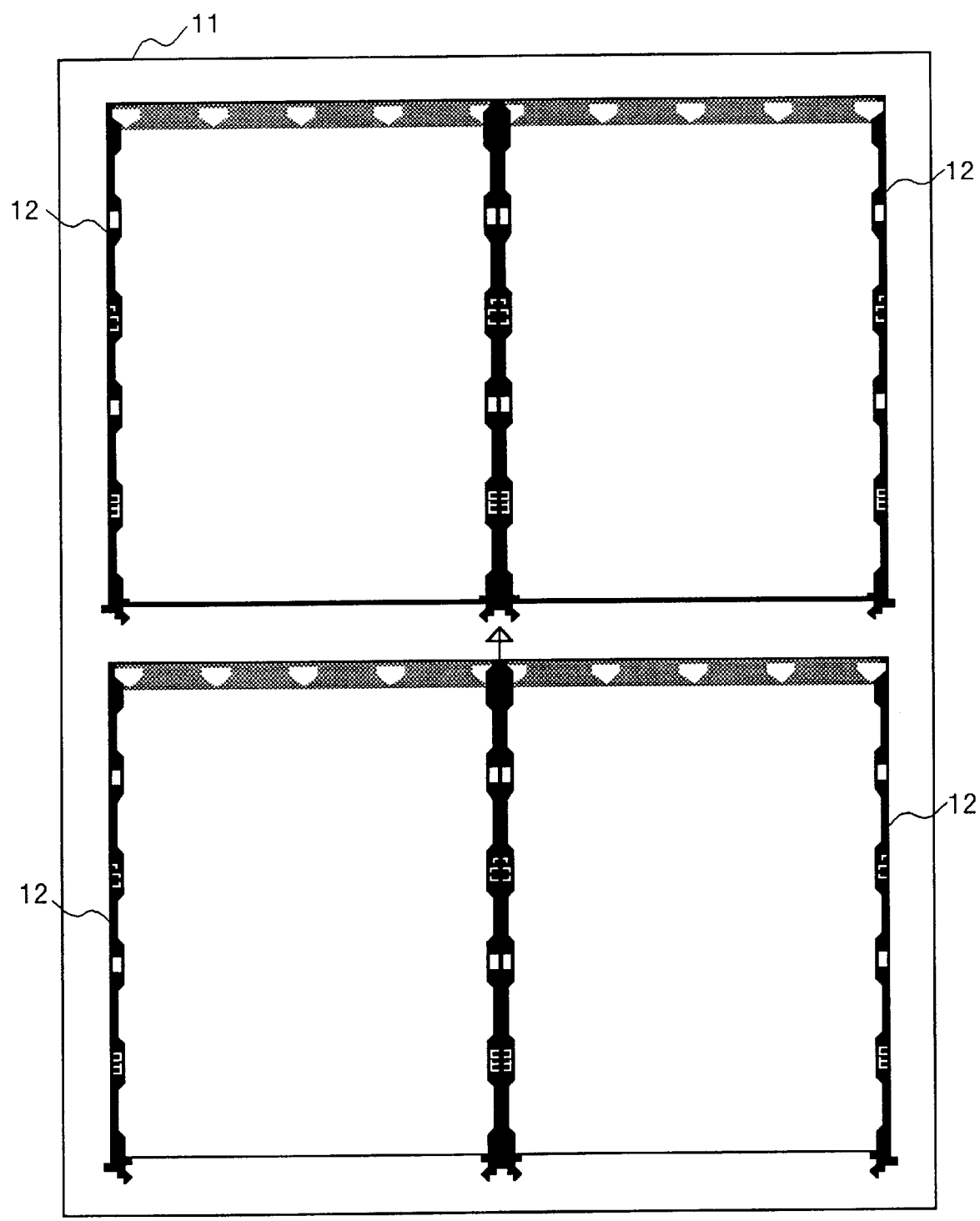
FIG. 1 shows an image of the glass from which a display device is prepared.
Figure 2:
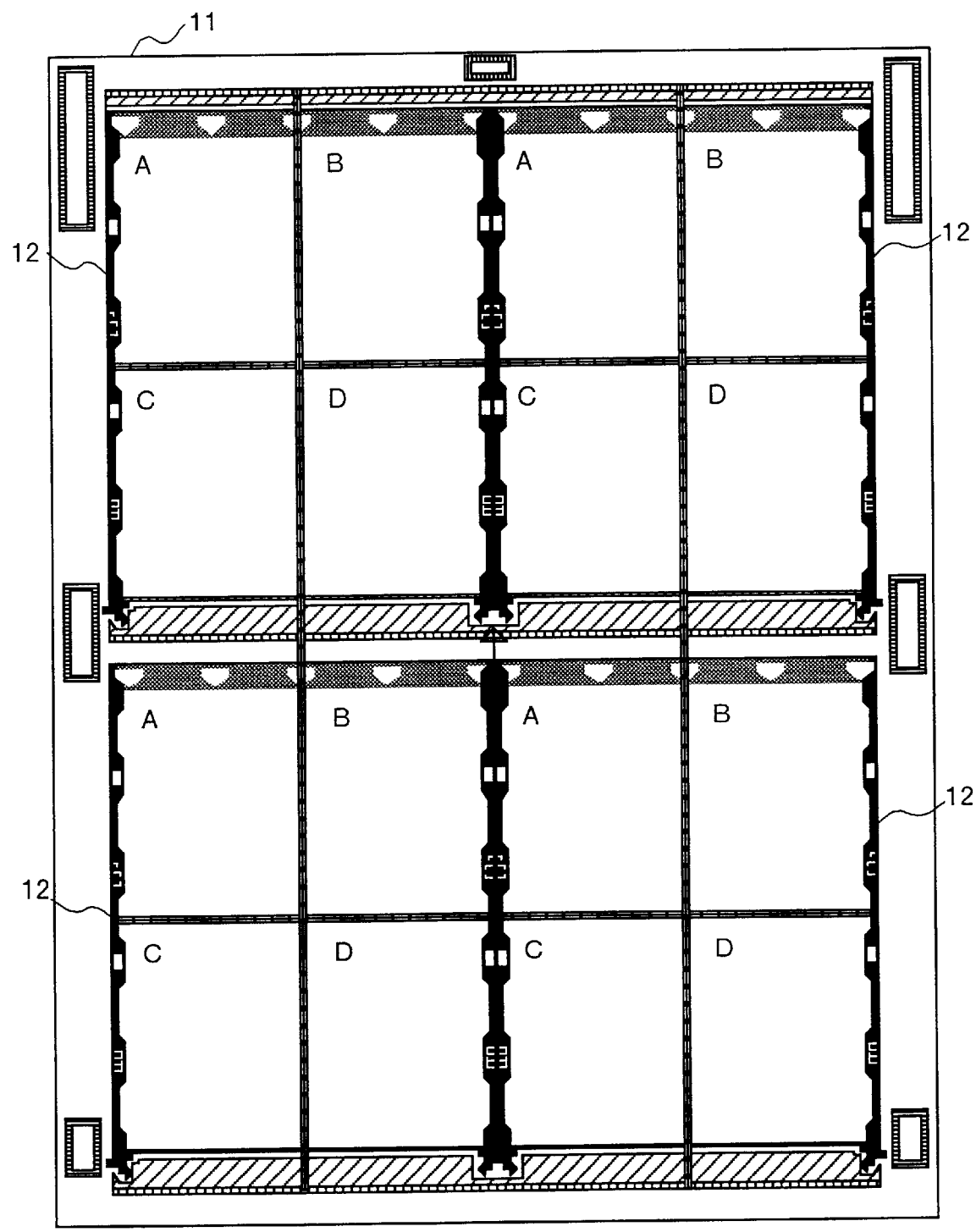
FIG. 2 shows a general glass image of a display device comprising a plurality of shot areas.
Figure 3:
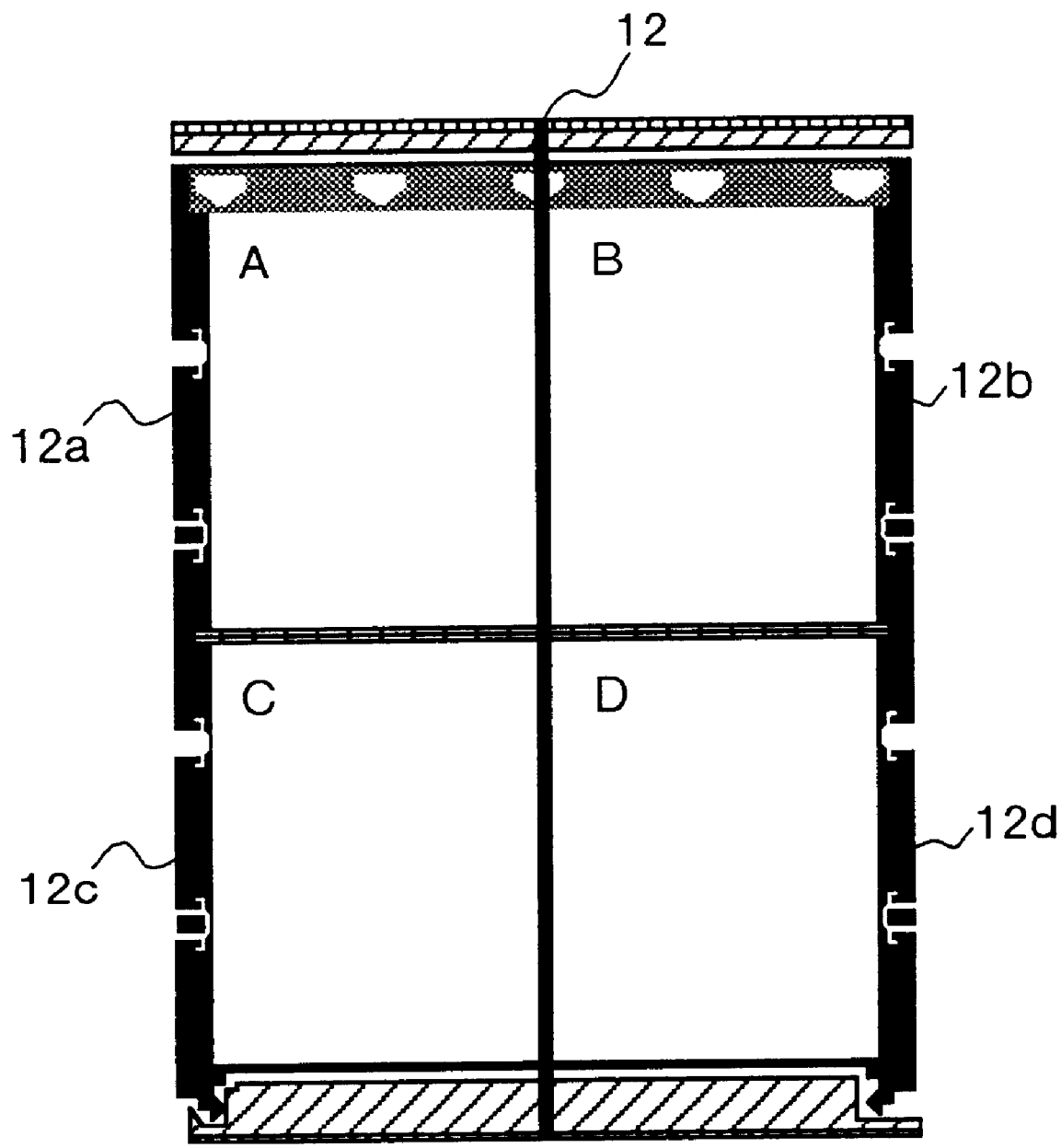
FIG. 3 shows a general glass image of a display device comprising a plurality of shot areas.
Figure 4:
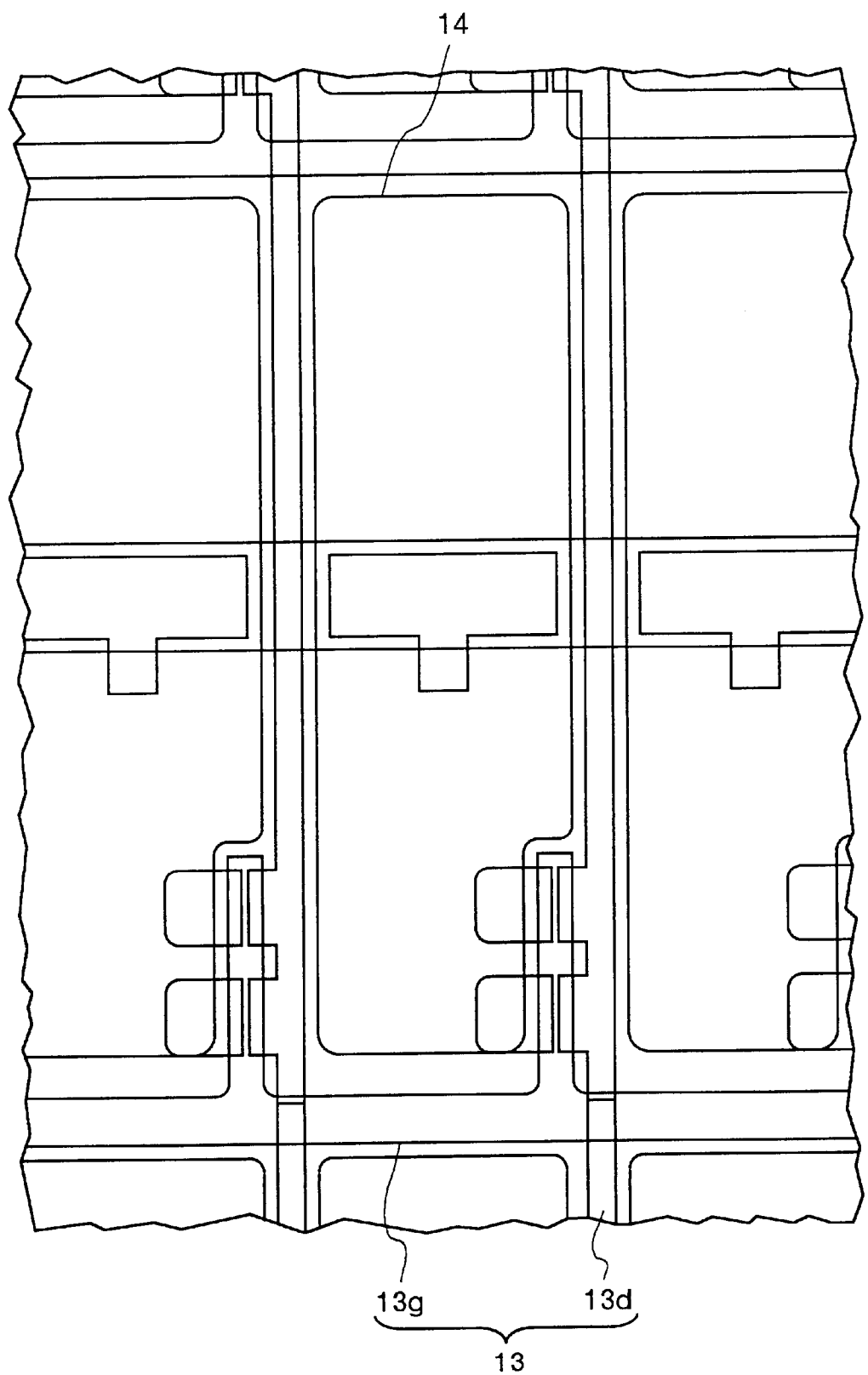
FIG. 4 shows a general image of a short area in a display image.
Figure 5:
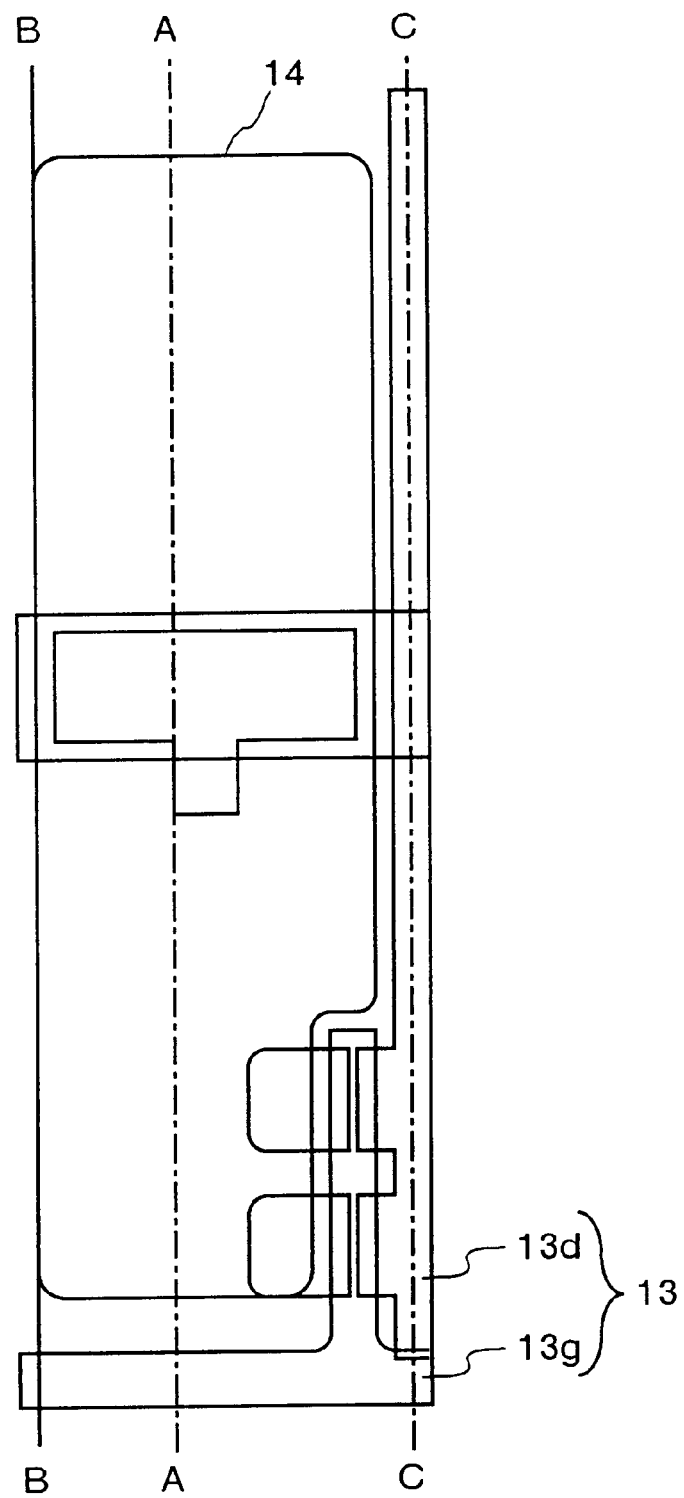
FIG. 5 shows a general image of a short area in a display image.
Figure 6:
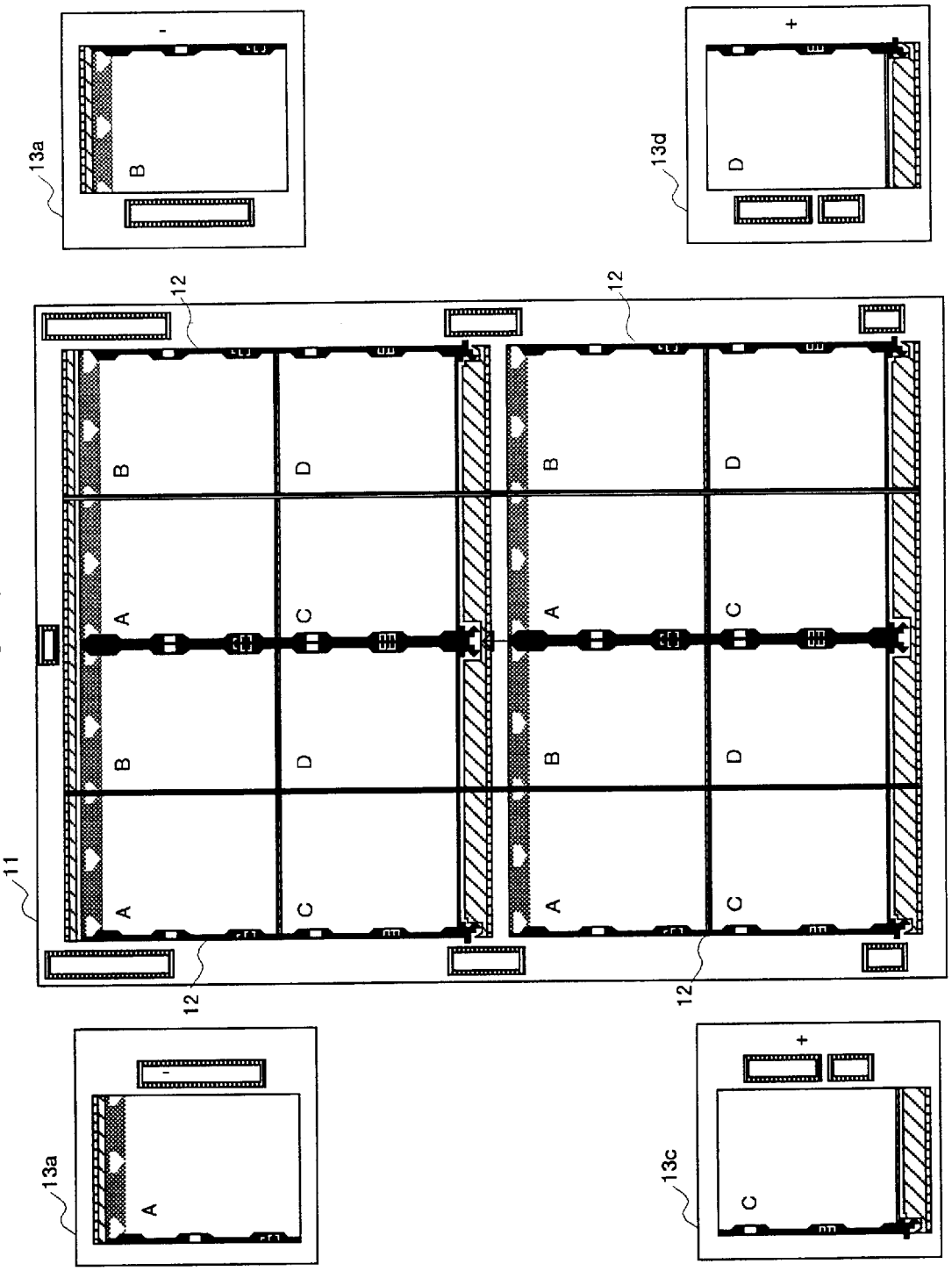
FIG. 6 shows a general glass image and reticules of a display device comprising a plurality of shot areas.
Figure 7:
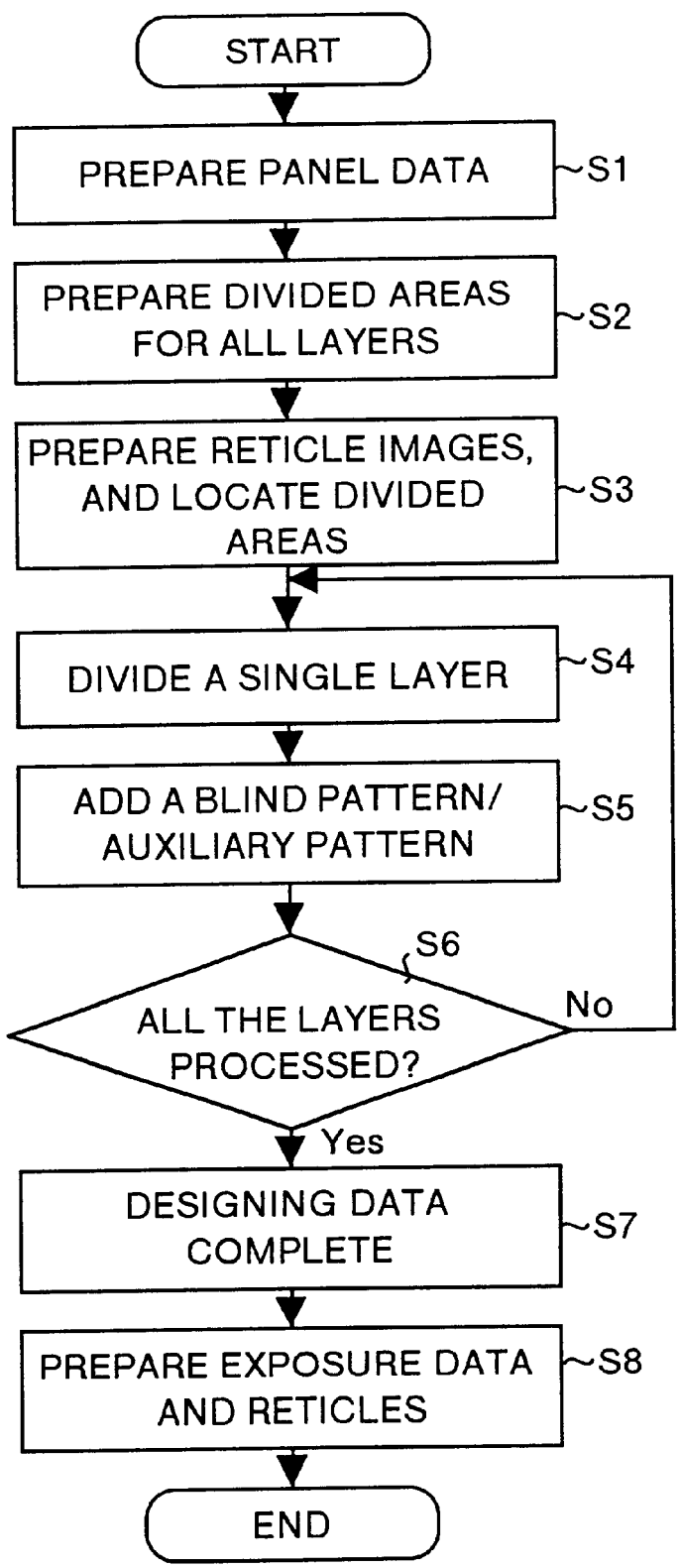
FIG. 7 is a flow chart showing an flow of operations for preparing reticules in the layout designing method based on the conventional technology.
Figure 8:
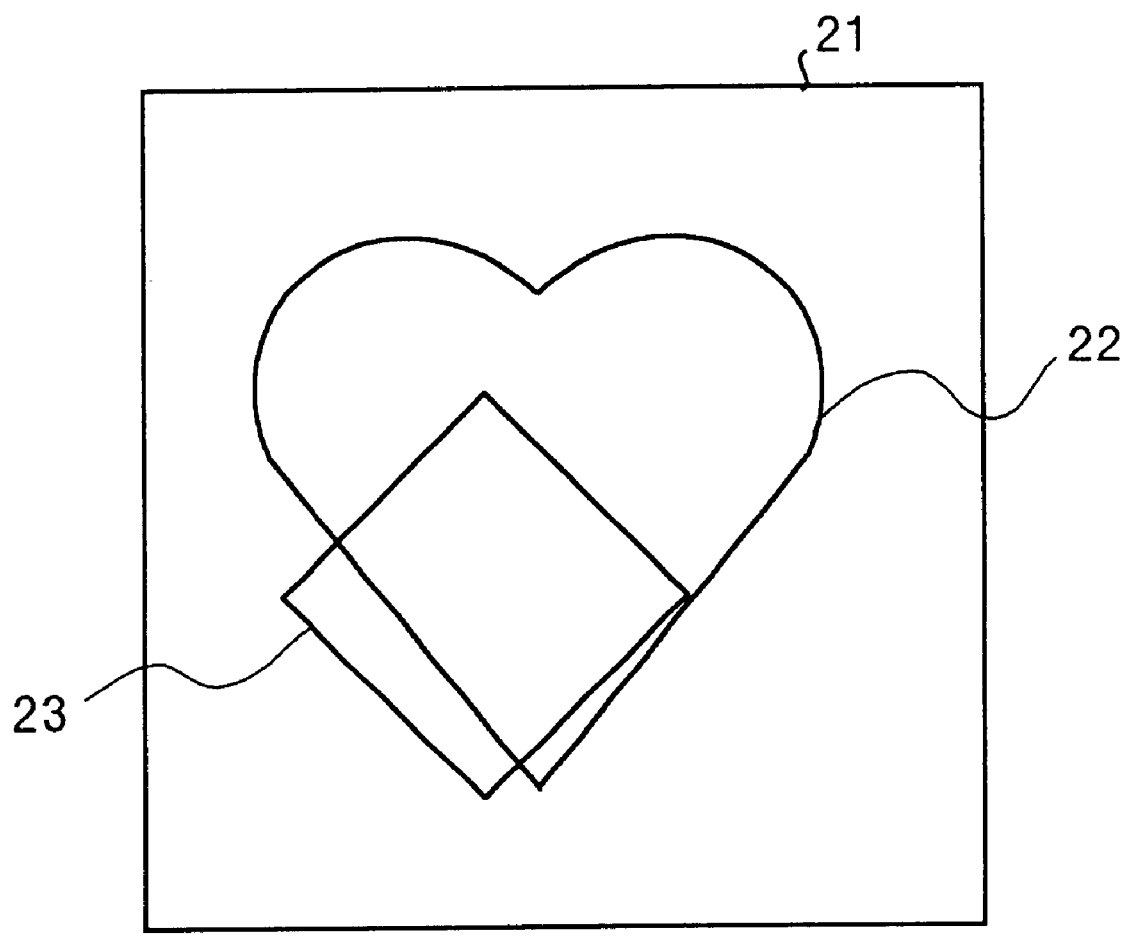
FIG. 8 is a simulated view showing an example of geometric pattern prepared in the operation flow shown in FIG. 7.
Figure 9:
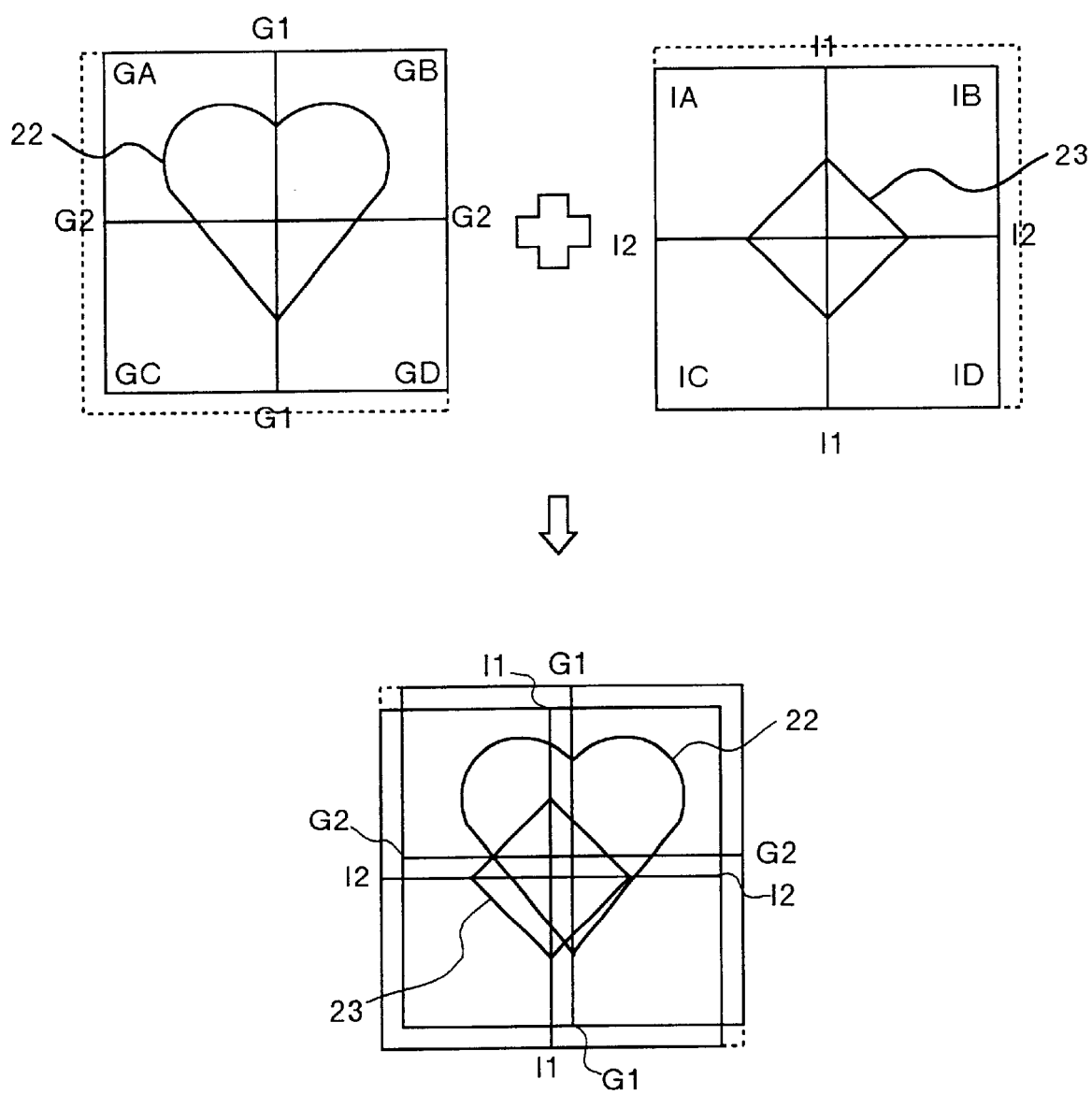
FIG. 9 is a simulated view showing an example of geometric pattern prepared in the operation flow shown in FIG. 7.
Figure 10:
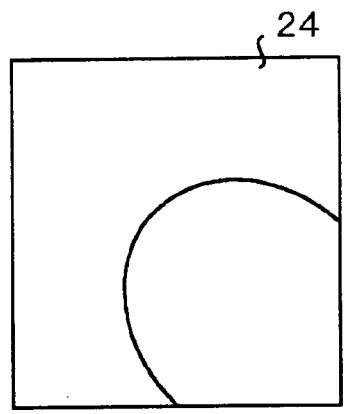
FIG. 10 is a simulated view showing an example of geometric pattern prepared in the operation flow shown in FIG. 7.
Figure 11:
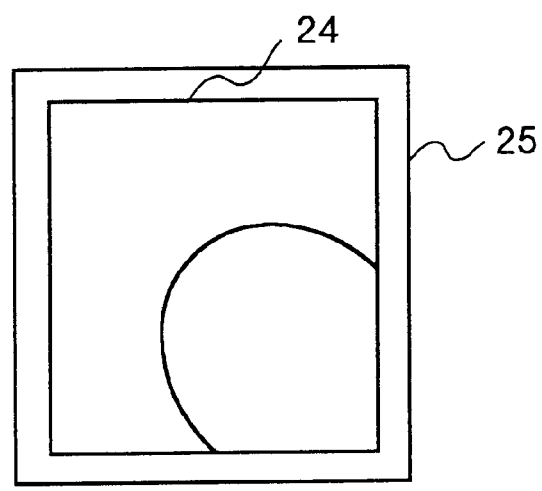
FIG. 11 is a simulated view showing an example of geometric pattern prepared in the operation flow shown in FIG. 7.
Figure 12:
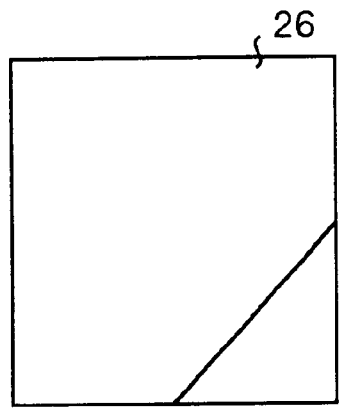
FIG. 12 is a simulated view showing an example of geometric pattern prepared in the operation flow shown in FIG. 7.
Figure 13:
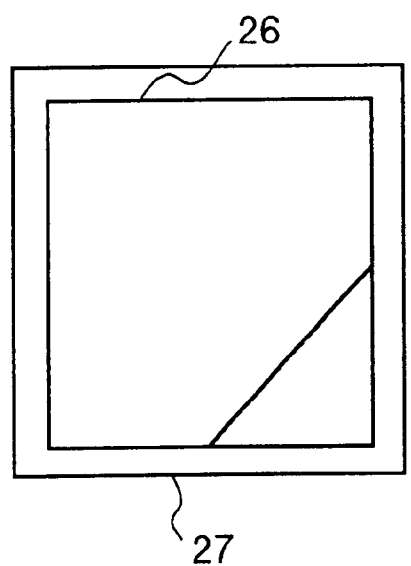
FIG. 13 is a simulated view showing an example of geometric pattern prepared in the operation flow shown in FIG. 7.
Figure 14A:
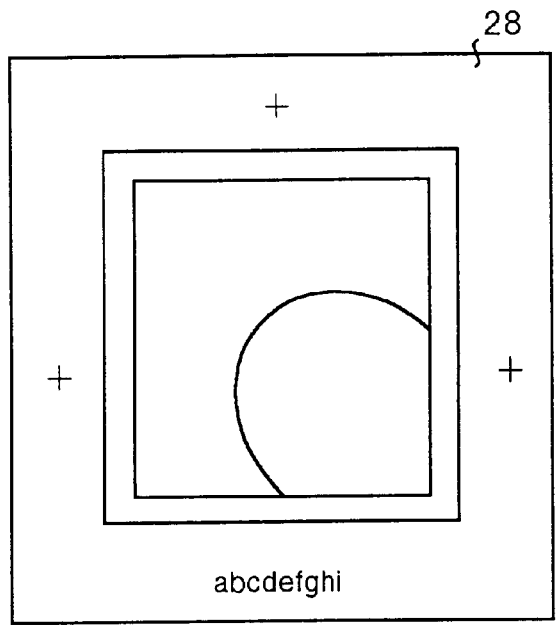
FIG. 14A is a simulated view showing an example of geometric pattern prepared in the operation flow shown in FIG. 7.
Figure 14B:
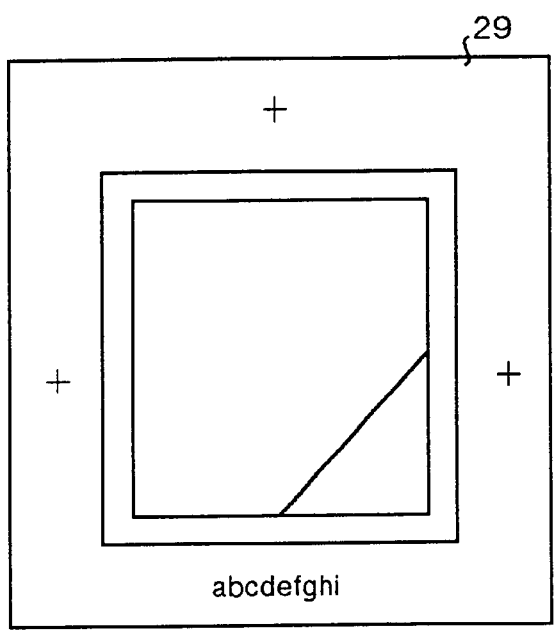
FIG. 14B is a simulated view showing an example of geometric pattern prepared in the operation flow shown in FIG. 7.
Figure 15A:
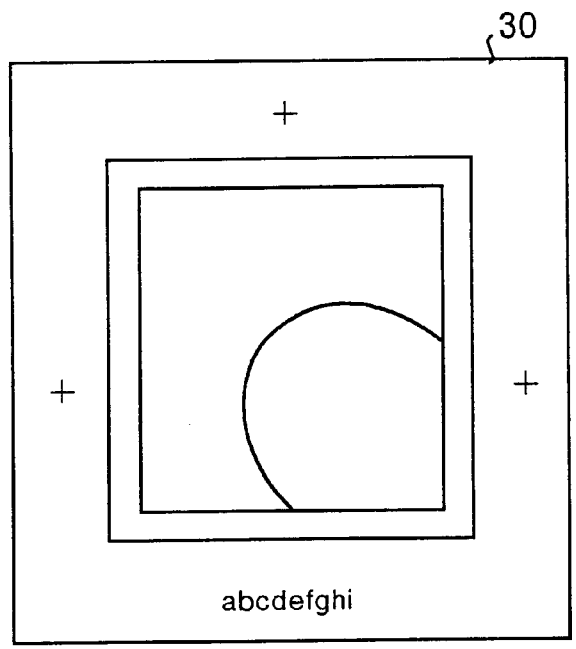
FIG. 15A is a simulated view showing an example of geometric pattern prepared in the operation flow shown in FIG. 7.
Figure 15B:
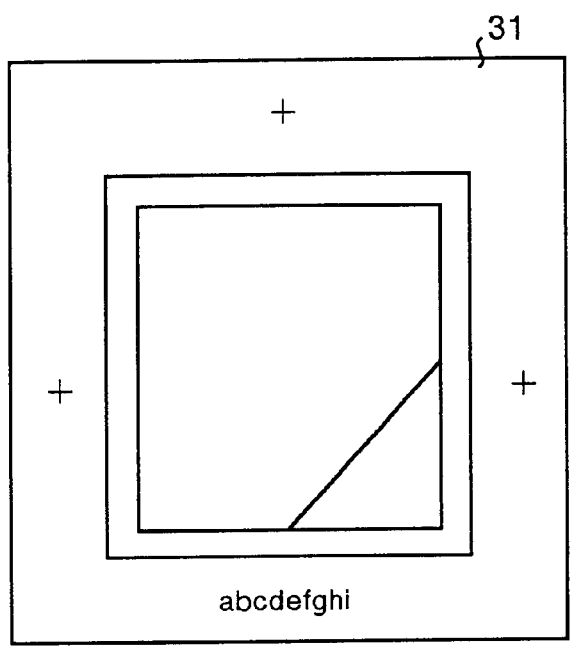
FIG. 15B is a simulated view showing an example of geometric pattern prepared in the operation flow shown in FIG. 7.

As shown in FIG. 16, when layout designing is started, at first panel data corresponding to the panel image shown in FIG. 8 is prepared (step S11). At the next step, all layers are divided into a plurality of areas as shown by the division images shown in FIG. 9 (step S12). The procedure up to step S12 is the same as that in the conventional technology, but the prepared divided areas are temporary ones.

Based on the all prepared areas for all layers, a suspected division area is then prepared so that all of the divided areas for each layer are included (step S13). More specifically, when a shot area 41 in the G layer and a shot area 42 in the I layer are displaced from each other as shown, for instance, in FIG. 17A, a suspected division area 43 is set so that the short areas 41, 42 for the layers GA and IA are included.

Although not specifically limited, the suspected division area is defined by coordinates of a vertex M included in the shot area 41 for the G layer but not included in the shot area 42 for the I layer and coordinates of a vertex N included in the shot area 42 for the I layer but not included in the shot area 42 for the layer I. Temporarily divided areas are prepared also for other divided areas, namely for shot areas GB and IB, shot areas GC and IC, and shot areas GD and ID shown in FIG. 9 in the similar way.

At the next step, images of shot areas obtained by dividing each layer are located in data for reticule images, and reticule images are prepared (step S14). Process patterns such as an alignment mark are also prepared.

Figure 18A:
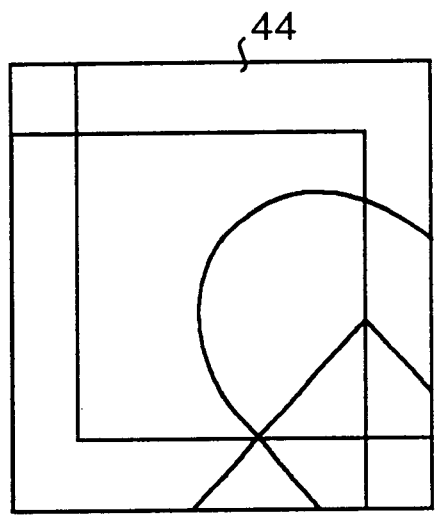
FIG. 18A is a simulated view showing an example of geometrical pattern prepared in the operation flow shown in FIG. 16.
Figure 18B:
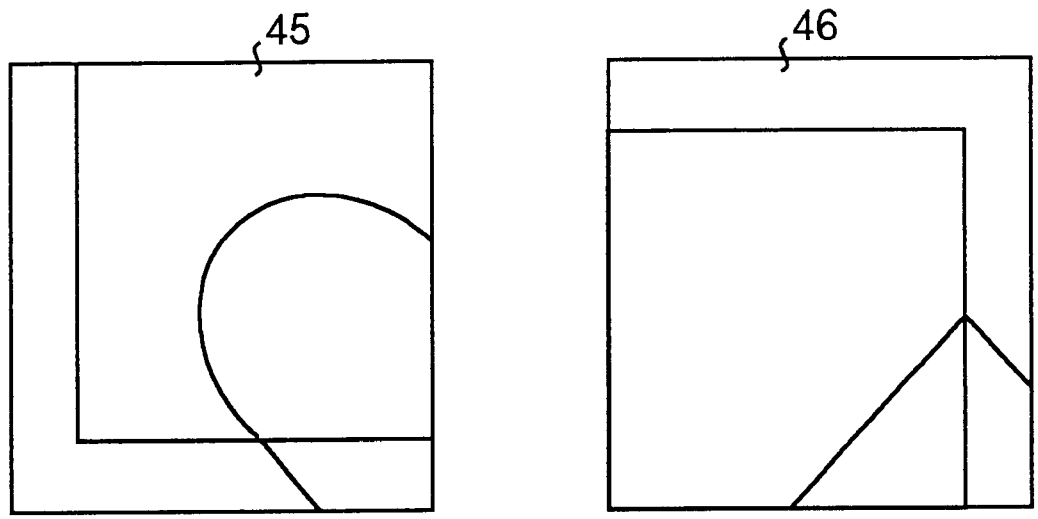
FIG. 18B is a simulated view showing an example of geometrical pattern prepared in the operation flow shown in FIG. 16.

All layers are then divided respectively based on the suspected division area (step S15). In otherwords, all of the layers are divided in batch based on the suspected division area. FIG. 18A shows a division image 44 of the suspected division area including shot areas for the layers GA and IA. FIG. 18B images 45, 46 of shot areas corresponding to the suspected division area shown in FIG. 18A for each of the G layer and I layer.

At the next step, a blind pattern is added to area which is not included by its nature in the shot area GA in the suspected division area. Further, a blind pattern is added also to an area which is not included by its nature in the shot area IA of the suspected division area. Further, a blind pattern is added to a section around the suspected division area. Further, a auxiliary patter is added (step S16).

Figure 19A:
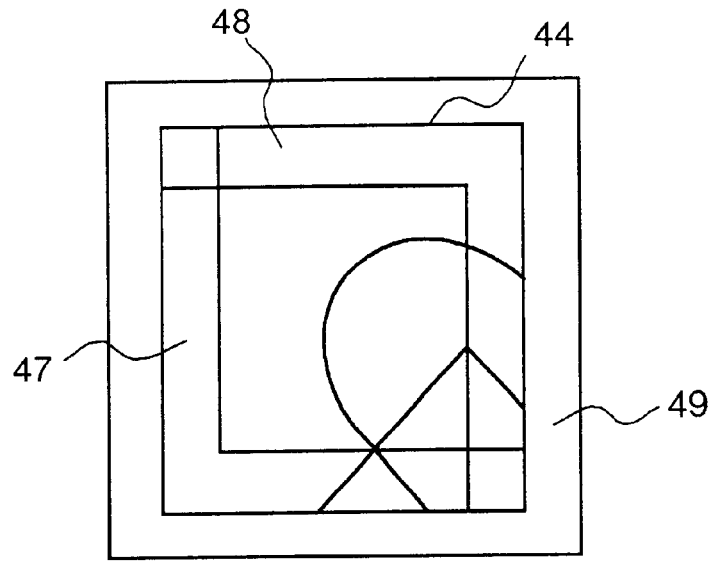
FIG. 19A is a simulated view showing an example of geometrical pattern prepared in the operation flow shown in FIG. 16.
Figure 19B:
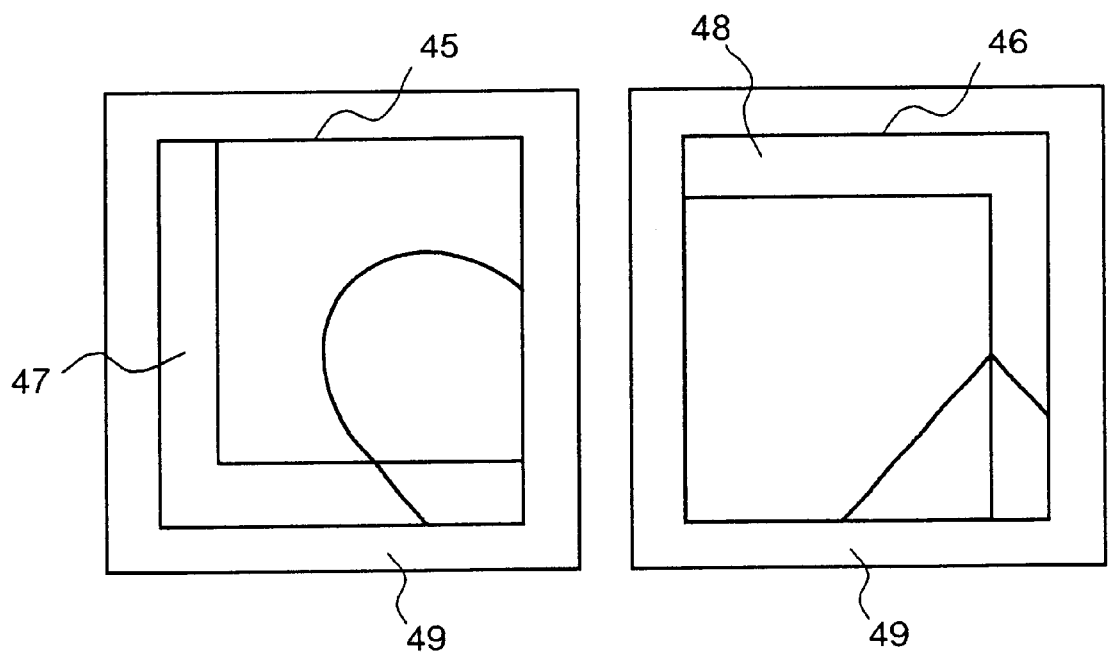
FIG. 19B is a simulated view showing an example of geometrical pattern prepared in the operation flow shown in FIG. 16.

FIG. 19A shows a state where blind patterns 47, 48, 49 are added to sections around an area not included in the shot area GA, an area not included in the shot area IA, and a divided image 44. FIG. 19B shows images of the G layer and I layer obtained by the image shown in FIG. 19A.

Figure 20:
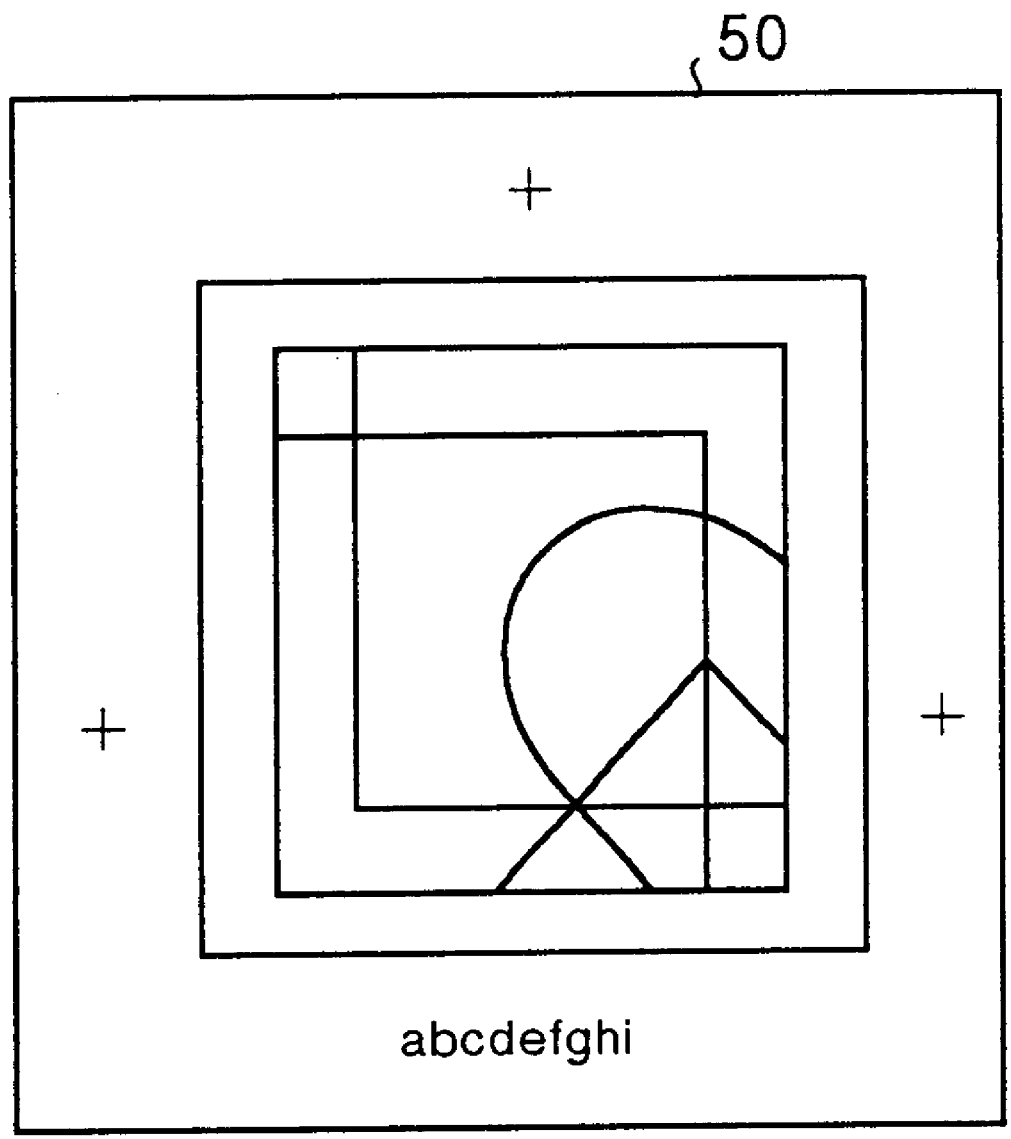
FIG. 20 is a simulated view showing an example of geometrical pattern prepared in the operation flow shown in FIG. 16.
Figure 21A:
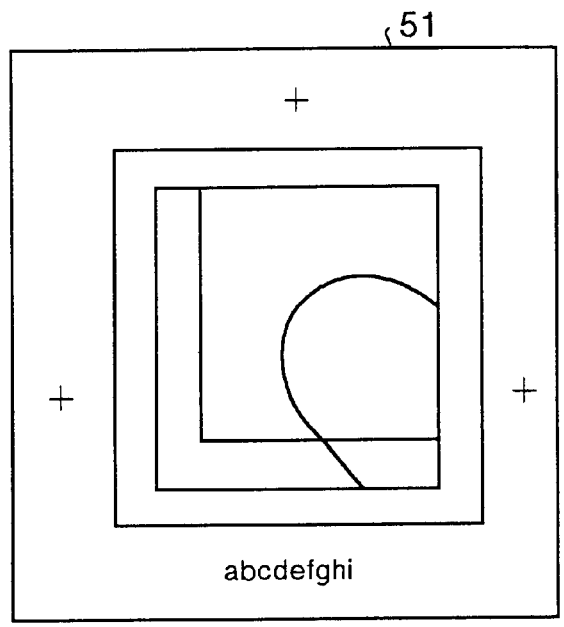
FIG. 21A is a simulated view showing an example of geometrical pattern prepared in the operation flow shown in FIG. 16.
Figure 21B:
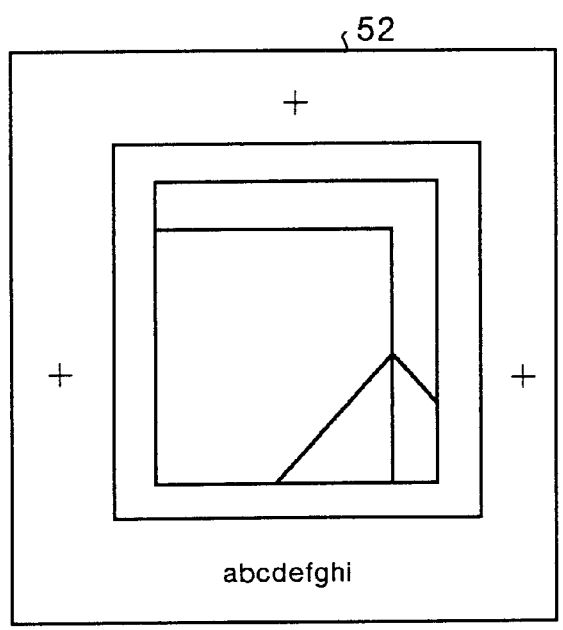
FIG. 21B is a simulated view showing an example of geometrical pattern prepared in the operation flow shown in FIG. 16.

In th is stage, preparation of designing data is completed (step S17). FIG. 20 shows prepared designing data 50. Based on the obtained designing data, exposure data and reticules are prepared (step S18). FIG. 21A and FIG. 21B show exposure data and reticules 51, 52 for the G layer and I layer respectively.

As described above, according to the first embodiment, when a display panel comprising a plurality of layers and designed by dividing each layer to a plurality of shot areas, a suspected division area is set so that shot areas corresponding to all of the layers are included, and all of the layers are divided in batch along the suspected division area, so that the time required for division of each layer can be shortened. Therefore, the designing cost can be reduced.

More specifically, in a case of a 5-inch display panel in which there are six types of shots, twenty total number of shots, and five layers, then five hours are required for division in the conventional technology, but it is estimated that only one hour is required according to the technology described in the first embodiment. Further, in a case of a 21-inch display panel in which there are fifteen types of shots, twenty-six total number of shots, and twenty-six layers, twenty-three hours is required for division in the conventional technology, but it is estimated that only 2.5 hours are required according to the technology described in the first embodiment.

A blind such as a stepper as an accessory may be used for blinding in place of shading an unnecessary potion by adding blind patterns 47, 48 to an area not included in the shot area Ga and an area not included in the shot area IA of an image 44 for the suspected division area , or blind patterns 47, 48 and a blind for an exposure device may be used together.

Figure 22:
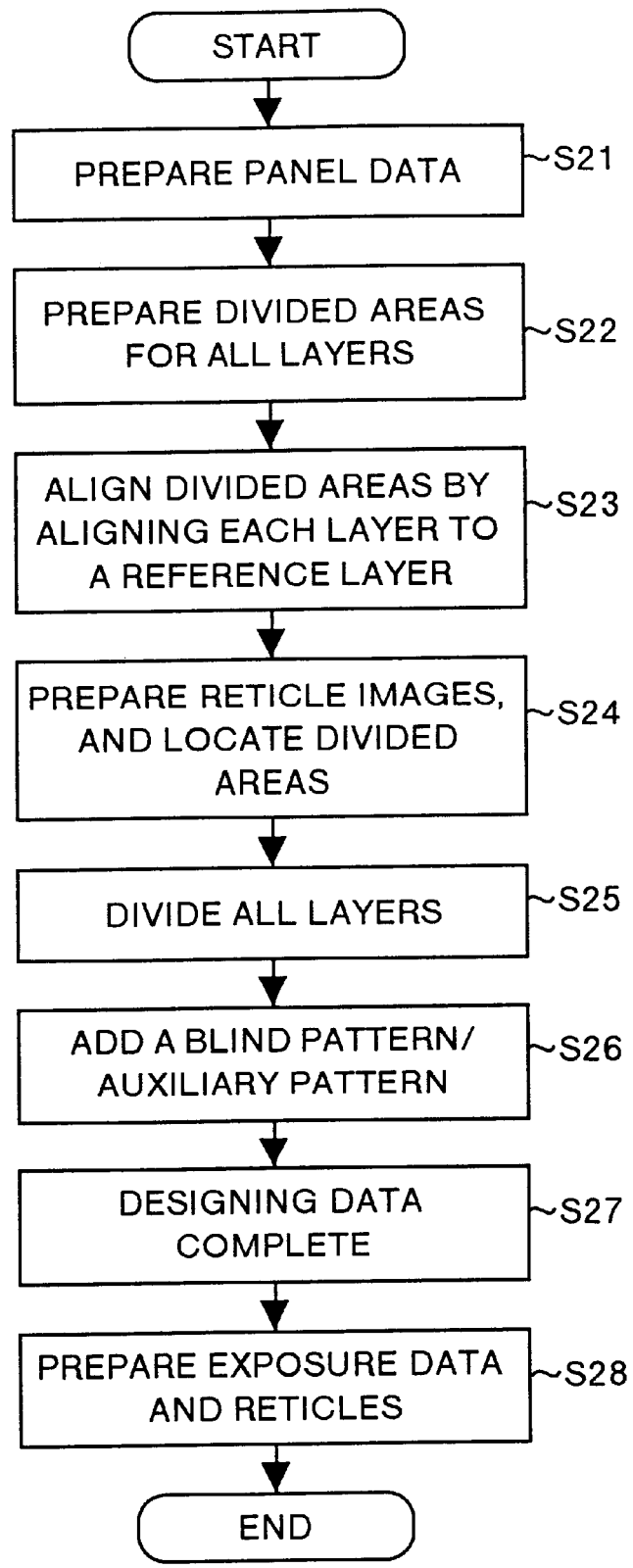
FIG. 22 is a flow chart showing a flow of operations for preparing reticules based on the layout designing method according to a second embodiment of the present invention.

FIG. 22 is a flow chart showing a flow of operations for preparation of reticules based on the display layout designing method according to a second embodiment of the present invention. FIG. 23A to FIG. 27B show examples of geometric pattern used when layout designing is executed for the panel image and division image shown in FIG. 8 and FIG. 9 respectively.

As shown in FIG. 22, when layout designing is started, at first panel data for the panel image shown in FIG. 8 is prepared (step S21). At the next step, all layers are divided as shown by the division image shown in FIG. 9 (step S22). The process up to this step is the same as that in the conventional technology, however, the obtained divided areas are temporary divided areas.

Figure 23A:
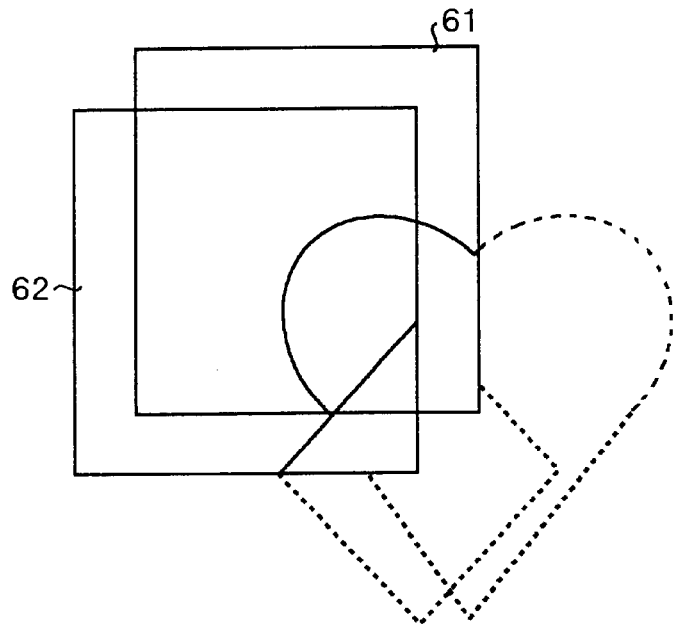
FIG. 23A is a simulated view showing an example of geometrical pattern prepared in the operation flow shown in FIG. 22.
Figure 23B:
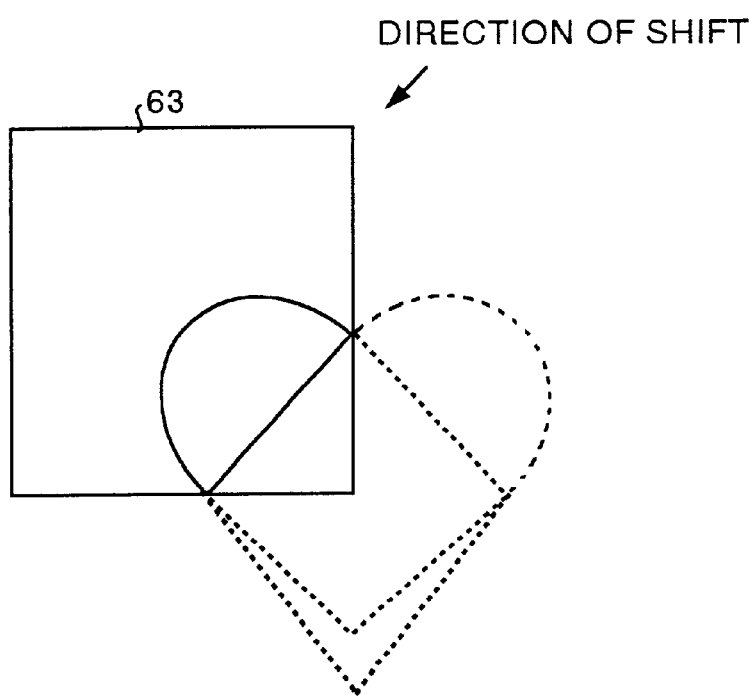
FIG. 23B is a simulated view showing an example of geometrical pattern prepared in the operation flow shown in FIG. 22.

Then a layer is used as a reference, and shot areas for other layers are aligned to the short areas in the reference layer (step S2.3). More specifically, for instance, as shown in FIG. 23A, when the shot area 61 of the G layer and shot area 62 of the I layer are displaced from each other, the I layer is used as a reference layer as shown in FIG. 23B, and the shot area 61 of the layer G is aligned to the shot area 62 of the I layer to obtain an area 63.

Coordinates of the G layer are shifted by the amount of displacement of the G layer from the I layer. The coordinates values may be shifted in designing data by differentiating structure of each layer, or may be changed by means of logical processing for each geometry. Other divided areas, namely shot areas GB, GC, and GD are similarly aligned to the shot areas IB, IC, and ID.

At the next step, images of the divided shot areas are located in data for reticule images to prepared reticule images (step S24). Similarly, process patterns such as an alignment mark are prepared.

Figure 24A:
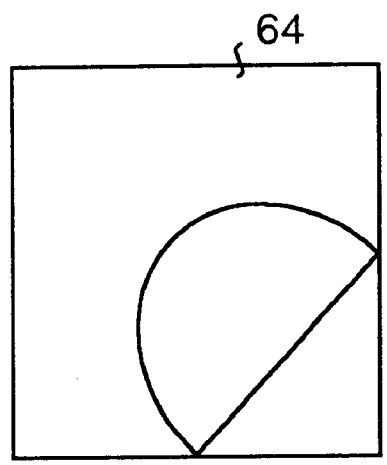
FIG. 24A is a simulated view showing an example of geometrical pattern prepared in the operation flow shown in FIG. 22.
Figure 24B:
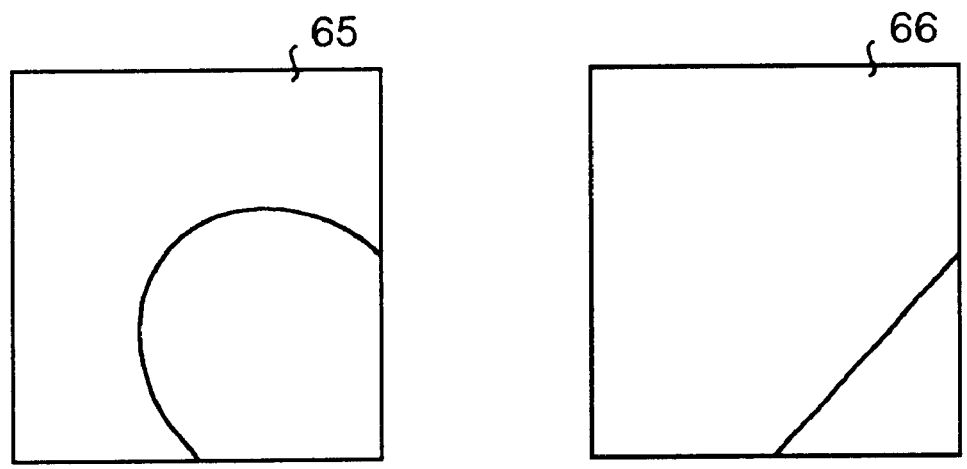
FIG. 24B is a simulated view showing an example of geometrical pattern prepared in the operation flow shown in FIG. 22.

As corresponding shot areas for all layers are aligned to each other, all of the layers are divided in batch (step S25). FIG. 24A shows a division image 64 of an area aligned to the shot area IA by displacing the short area GA. FIG. 24B shows images 65, 66 of areas corresponding to those in FIG. 24A for the layer G and layer I.

Figure 25A:
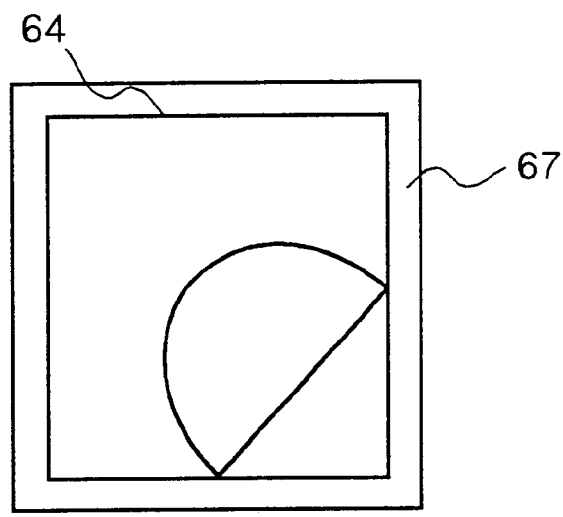
FIG. 25A is a simulated view showing an example of geometrical pattern prepared in the operation flow shown in FIG. 22.
Figure 25B:
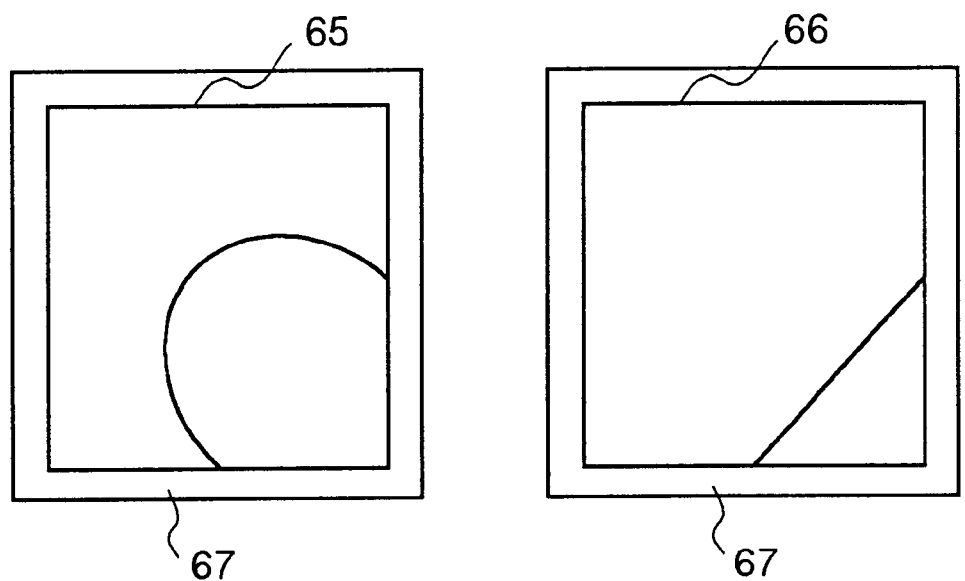
FIG. 25B is a simulated view showing an example of geometrical pattern prepared in the operation flow shown in FIG. 22.
Figure 26:
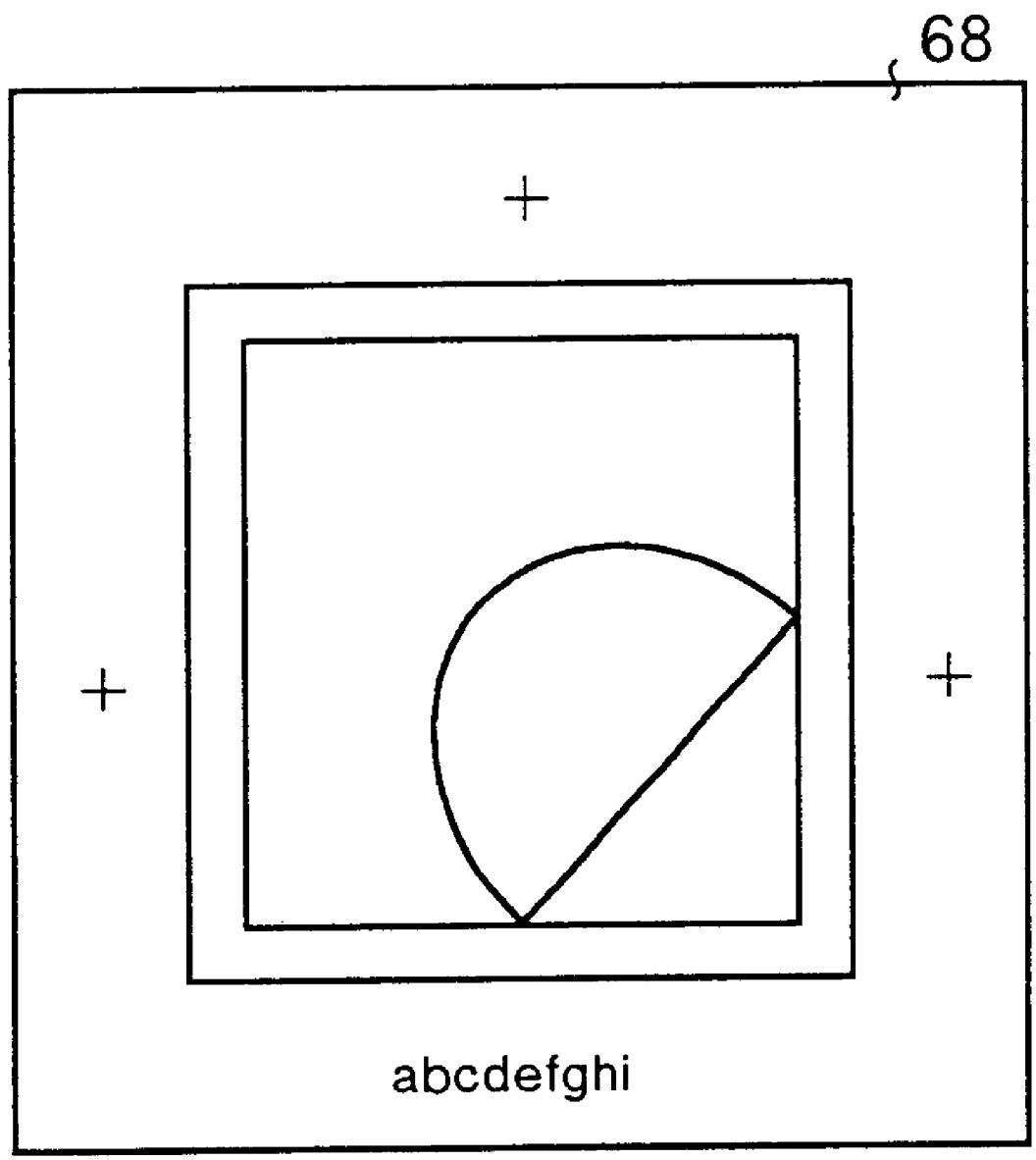
FIG. 26 is a simulated view showing an example of geometrical pattern prepared in the operation flow shown in FIG. 22.

Blind patterns are added to sections around the areas divided in batch (step S26). FIG. 25A shows a state where a blind pattern 67 is added to a section around the image 64 of the areas divided in batch. FIG. 25B shows images obtained by dividing the image shown in FIG. 25A to those for the G layer and I layer.

Figure 27A:
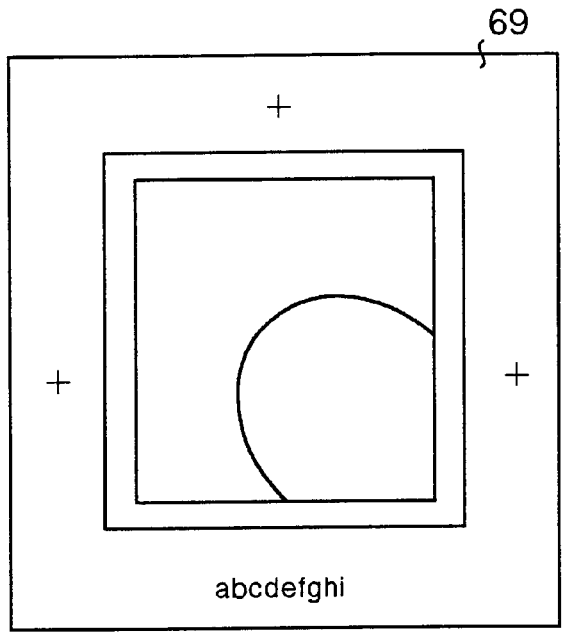
FIG. 27A is a simulated view showing an example of geometrical pattern prepared in the operation flow shown in FIG. 22.
Figure 27B:
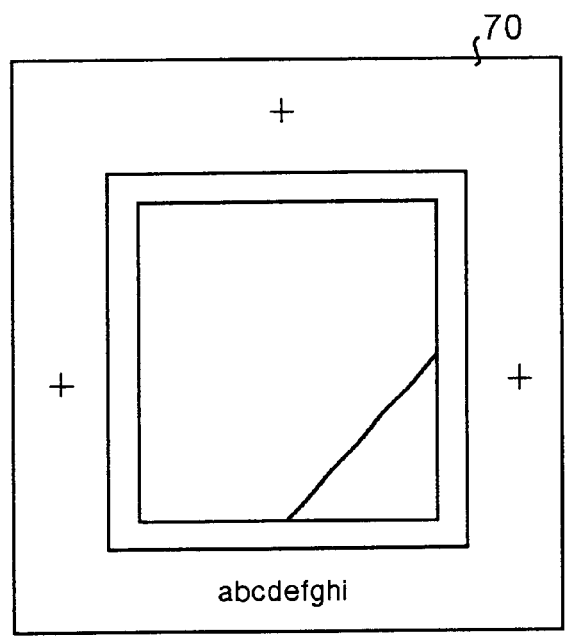
FIG. 27B is a simulated view showing an example of geometrical pattern prepared in the operation flow shown in FIG. 22.

In this stage, preparation of designing data is finished (step S27). Based on the obtained designing data, exposure data and reticules are prepared (step S28). When preparing reticules, for the layers (G layer) other than the layer treated as a reference step S23 (I layer), the shot areas are offset by the amount of displacement for aligning the other layers to the reference layer. FIG. 27A and FIG. 27B show exposure data and reticules 69, 70 for the G layer and According to the second embodiment, when a display panel comprising a plurality of layers and designed by dividing each layer to a plurality of shot areas, divided areas for all layers are aligned by other layers to a reference layer, and all of the layers are divided in batch along the aligned divided areas, so that the time required for division can be reduced. Further the designing cost can be reduced.

More specifically, in a case of a 5-inch display panel in which there are six types of shot, twenty shots, and five layers, or in a case of a 21-inch display panel in which there are fifteen types of shot, twenty-six shots, and six layers, it is estimated that the time required for division is one hour or 2.5 hours like in the first embodiment respectively.

In place of offsetting shot areas to reticules for other layers (G layer) other than the layer treated as a reference at step S23 (I layer), exposure may be performed, when the processing for exposure is performed with an exposure device such as a stepper, by offsetting the shot areas by a rate of displacement of other layers to the reference layer in alignment.

The present invention is applicable not only to a case where two layers, namely the G layer and I layer are divided in batch, but also to a case where three of more layers are divided in batch. When a number of layers constituting a display panel is three or more, only some of the layers may be divided in batch. Further the present invention is applicable not only to designing of a display device, but also to designing of a device comprising a plurality of layers and designed by dividing each layer to a plurality of shot areas.

According to the layout designing method of a display device of one aspect of the present invention, when a display panel comprising a plurality of layers and designed by dividing each layer to a plurality of shot areas is designed, a suspected division area is set so that corresponding layers for all of the layers are included, and all of the layers are divided in batch along the suspected division area, so that the time required for division can be shortened. As a result, the designing cost can be reduced.

According to the layout designing of a display device of another aspect of the present invention, when a display panel comprising a plurality of layers and designed by dividing each layer to a plurality of shot areas, divided areas for all layers are aligned by aligning other layers to a reference layer, and all of the layers are divided in batch along the aligned divided areas, so that the time required for division can be shortened. As a result, the designing cost can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed:

1. A layout designing method of a display device, the display device having a plurality of layers, the method comprising:

dividing said display device into a plurality of shot areas;

setting a suspected division area for each of said shot areas, the division area comprising the layers of the respective shot area;

dividing all of said layers at one time along said suspected division area; and creating a light-resistance coating over a portion in said suspected division area which is not included in a shot area of any of said layers after said dividing.

2. The layout designing method of a display device according to claim 1, wherein said light-resistant coating is formed by applying a light-resistive band.

3. The layout designing method of a display device according to claim 1, wherein said light-resistant coating is formed by a blind for an exposure device.

4. A layout designing method of a display device, the display device having a plurality of layers, the method comprising:

dividing said display device into a plurality of shot areas;

aligning the corresponding shot areas in all of said layers by shifting layers other than a reference layer with respect to said reference layer; and dividing all of said layers at one time along said aligned shot areas.

5. The layout designing method of a display device according to claim 4 further comprising positioning a shot region at a reticule by offsetting said other layers to said reference layer by an amount of displacement of said other layers.

6. The layout designing method of a display device according to claim 4, wherein an amount of displacement of said other layers with respect to said reference layer is used as the amount of offset during exposure.

* * * * *